(12) United States Patent
Tankielun et al.

(10) Patent No.: US 11,762,001 B2
(45) Date of Patent: Sep. 19, 2023

(54) MEASUREMENT ARRANGEMENT AND MEASUREMENT METHOD

(71) Applicant: Rohde & Schwarz GmbH & Co. KG, Munich (DE)

(72) Inventors: Adam Tankielun, Ottobrunn (DE); Corbett Rowell, Munich (DE)

( * ) Notice: Subject to any disclaimer, the term of this patent is extended or adjusted under 35 U.S.C. 154(b) by 0 days.

(21) Appl. No.: 17/648,325

(22) Filed: Jan. 19, 2022

(65) Prior Publication Data

US 2022/0137115 A1    May 5, 2022

Related U.S. Application Data

(63) Continuation of application No. 16/202,995, filed on Nov. 28, 2018, now Pat. No. 11,269,000.

(30) Foreign Application Priority Data

Feb. 15, 2018    (EP) ..................................... 18156955

(51) Int. Cl.
*G01R 29/10*    (2006.01)
*G01R 29/08*    (2006.01)

(52) U.S. Cl.
CPC .............. *G01R 29/10* (2013.01); *G01R 29/08* (2013.01); *G01R 29/0878* (2013.01)

(58) Field of Classification Search
CPC ..... G01R 29/08; G01R 29/0878; G01R 29/10
USPC .......................... 455/67.12; 342/359, 750.16
See application file for complete search history.

(56) References Cited

U.S. PATENT DOCUMENTS

| | | |
|---|---|---|
| 5,365,241 A | 11/1994 | Williams et al. |
| 5,410,324 A | 4/1995 | Bolomey et al. |
| 9,991,591 B1 | 6/2018 | Rowell et al. |
| 9,991,592 B1 | 6/2018 | Rowell et al. |
| 11,269,000 B2 * | 3/2022 | Tankielun .......... G01R 29/0878 |
| 2002/0158804 A1 | 10/2002 | Marti-Canales et al. |
| 2004/0155824 A1 | 8/2004 | Nagashima |
| 2009/0160706 A1 * | 6/2009 | Oh ........................ G01R 29/10 342/359 |
| 2013/0093447 A1 | 4/2013 | Nickel et al. |

(Continued)

FOREIGN PATENT DOCUMENTS

| | | |
|---|---|---|
| EP | 1468300 B1 | 2/2007 |
| JP | H0357971 A | 3/1991 |

(Continued)

OTHER PUBLICATIONS

Extended Search Report from counterpart European Application No. 18156955.9, dated Sep. 12, 2018, 35 pp.

(Continued)

*Primary Examiner* — Tan H Trinh
(74) *Attorney, Agent, or Firm* — Erik Swenson

(57) ABSTRACT

Measurement arrangement and method for measuring an electromagnetic field. It is for this purpose that a measurement probe is arranged on a mechanical probe positioning structure and moved along a number of one or more circular tracks. In this way, the measurement probe can be subsequently located at multiple different spatial positions and the corresponding electromagnetic signal can be measured. Accordingly, properties of an electromagnetic field can be determined by taking into account the measured electromagnetic signal with respect to the related spatial position.

12 Claims, 2 Drawing Sheets

(56) References Cited

U.S. PATENT DOCUMENTS

| | | | |
|---|---|---|---|
| 2013/0271317 A1 | 10/2013 | Goel et al. | |
| 2013/0303944 A1* | 11/2013 | Duindam | A61B 5/065 |
| | | | 600/585 |
| 2014/0256267 A1* | 9/2014 | Chien | H04B 17/15 |
| | | | 455/67.12 |
| 2017/0082669 A1 | 3/2017 | Park et al. | |
| 2018/0034566 A1* | 2/2018 | Tankielun | H04B 17/12 |
| 2018/0238948 A1* | 8/2018 | Hisatake | G01R 29/0814 |
| 2018/0287721 A1* | 10/2018 | Vikstedt | G01R 31/001 |
| 2019/0036621 A1* | 1/2019 | Vanwiggeren | H04B 17/354 |
| 2019/0068296 A1 | 2/2019 | Rowell et al. | |
| 2019/0115941 A1 | 4/2019 | Noda | |
| 2019/0159708 A1 | 5/2019 | Mortellaro et al. | |
| 2019/0215085 A1* | 7/2019 | Rowell | H04B 17/15 |

FOREIGN PATENT DOCUMENTS

| | | |
|---|---|---|
| JP | H05133989 A | 5/1993 |
| JP | 2001133495 A | 5/2001 |

OTHER PUBLICATIONS

Non-Final Office Action, U.S. Patent and Trademark Office, U.S. Appl. No. 16/202,995, dated Jul. 2, 2021, 13 pgs.

Notice of Allowance and Fee(s) Due, U.S. Patent and Trademark Office, U.S. Appl. No. 16/202,995, dated Oct. 22, 2021, 5 pgs.

Response to Non-Final Office Action, U.S. Appl. No. 16/202,995, dated Oct. 4, 2021, 12 pgs.

* cited by examiner

MEASUREMENT ARRANGEMENT AND MEASUREMENT METHOD

TECHNICAL FIELD

The present invention relates to a measurement arrangement for measuring an electromagnetic field. The present invention further relates to a respective measurement method.

BACKGROUND

Although applicable in principle to any wireless test system, the present invention and its underlying problem will be hereinafter described in combination with a test environment for a wireless device.

In modern communication systems the wireless communication devices have to fulfil multiple standards and legal regulations. It is for this purpose that during development or production of the devices there is a need to thoroughly test the devices for compliance with communication standards and legal regulations.

In order to perform the respective tests it is necessary to provide an appropriate test environment. In particular, the test environment also has to fulfil predetermined requirements and standards.

SUMMARY

Against this background, there is the need to provide a measurement arrangement and a measurement method for characterizing electromagnetic properties of a test scenario.

According to aspects of the present invention, a test arrangement having the features of claim 1 and a test method having the features of claim 15 is provided.

According to a first aspect, a measurement arrangement for measuring an electromagnetic field is provided. The measurement arrangement comprises a measurement probe, a mechanical probe positioning structure and an analyzing device. The measurement probe is adapted to measure an electromagnetic signal. The measurement probe may further provide a measurement signal corresponding to the measured electromagnetic signal. The mechanical probe positioning structure is adapted to carry the measurement probe. The mechanical probe positioning structure further may controllably move the measurement probe. Especially, the mechanical probe positioning structure is adapted to perform a rotational movement of the measurement probe around a predetermined axis. The analyzing device is adapted to determine a rotational angle of the mechanical probe positioning structure with respect to a predetermined reference position. The analyzing device may further be adapted to compute an electromagnetic field based on measurement signals measured by the measurement probe at a number of at least two different rotational angles.

According to a further aspect, a measurement method for measuring an electromagnetic field is provided. The measurement method comprises the steps of measuring an electromagnetic signal by a probe and providing a measurement signal corresponding to the measured electromagnetic signal. The method may further comprise a step of carrying the measurement probe and controllably move the measurement probe by a mechanical probe positioning structure. Especially, the mechanical probe positioning structure may perform a rotational movement of the measurement probe around a predetermined axis.

As explained above, the characterization of a measurement environment, for instance, a quiet zone in a test chamber, is important for certification and standardization. Further, a detailed knowledge of the electromagnetic circumstances may be very important for characterization of an electromagnetic field in a measurement environment for measuring electromagnetic properties of a device. The present invention is therefore based on the fact that there is a need for a versatile and efficient measurement of electromagnetic fields, in particular of electromagnetic fields in a measurement environment.

The present invention therefore aims to provide a measurement arrangement and measurement method in order to provide a simplified, fast and low cost measurement of electromagnetic fields for characterizing the electromagnetic properties. This object can be achieved by measuring electromagnetic signals by a small number of measurement probes which can be moved around for successively measuring electromagnetic signals at multiple different spatial positions. By considering the measurement signals in association with the corresponding spatial positions of the measurement probe when measuring the respective signal, a characterization of an electromagnetic field can be performed in an efficient manner by a small number of measurement probes. Thus, the costs for measuring the electromagnetic field can be reduced.

The measurement probe may comprise, for instance, a probe antenna or antenna system for receiving electromagnetic signals. Especially, the probe antenna may be any kind of appropriate antenna for receiving radiofrequency signals in a desired frequency range. In particular, the probe antenna may be adapted to receive radiofrequency signals having an arbitrary polarity. Furthermore, it may be also possible to use a probe antenna for receiving radiofrequency signals having only a desired polarization.

The received electromagnetic signal can be forwarded to the analyzing device. For this purpose, the measured electromagnetic signal may be forwarded to the analyzing device by means of a wired connection. For instance, a coaxial cable may be used for connecting the measurement probe with the analyzing device. However, it is understood that any other wired connection for connecting the measurement probe and the analyzing device may be also possible. Furthermore, it is possible that the received electromagnetic signal may be converted before forwarding the signal to the analyzing device. For instance, the measurement probe may convert the received electromagnetic signal into an optical signal, and forward the converted optical signal to the analyzing device by means of an optical fiber. In this way, electromagnetic interferences in the measurement environment can be reduced.

The mechanical probe positioning structure may be any kind of structure for moving the measurement probe around. In particular, the mechanical probe positioning structure may move around the measurement probe at a circular track around a predetermined axis. In particular, the predetermined axis may be parallel to a main axis of the measurement antenna of the measurement probe. Furthermore, it may be also possible that the predetermined axis may be perpendicular to a particular plane, for instance a ground plane of a measurement environment.

The mechanical probe positioning structure may comprise an element for carrying the measurement probe and moving the measurement probe along a spherical track. For this purpose, the mechanical positioning structure may comprise an appropriate element for carrying the measurement probe, for instance a circular disc or the like. However, in order to reduce the influence of the mechanical probe positioning structure, the element for carrying the measurement probe may have a rod-shaped structure or the like. In particular, the structure for carrying the measurement probe may be formed based on a dielectric material. Accordingly, the influence of the mechanical probe positioning structure on the propagation of the radiofrequency signals can be reduced. In particular, the rod-shaped structure of the mechanical probe positioning structure may be perpendicular to the predetermined axis around which the measurement probe rotates.

The analyzing device determines the spatial position of the measurement probe based on a determined rotational angle of the mechanical probe positioning structure with respect to a predetermined reference position. The predetermined reference position may be any arbitrary reference position which can serve as a basis for specifying the current orientation of the mechanical probe positioning structure. Furthermore, the analyzing device may additionally take into account a distance between the predetermined axis around which the measurement probe rotates and the measurement probe on the mechanical probe positioning structure. Based on these parameters, the analyzing device can determine the spatial position of the measurement probe. Accordingly, the analyzing device can assign the determined spatial position of the measurement probe and the measurement signal provided by the measurement probe at the respective spatial position. By performing at least two measurements at different spatial positions, the analyzing device may compute appropriate data of an electromagnetic field based on the measurement signals and the corresponding spatial position of the measurement probe. Accordingly, it is possible to obtain information about the electromagnetic field in a measurement plane covered by rotating the measurement probe on a circular track around the predetermined axis.

Furthermore, by modifying the distance between the measurement probe and the predetermined axis around which the measurement probe rotates, it is possible to refer to a plurality of circular tracks and the corresponding measurement signals for computing the electromagnetic field. In this way, it is possible to obtain a huge number of measurements for precisely determining electromagnetic field on a plane perpendicular to the predetermined axis around which the measurement probe rotates. In this way, the information about the electromagnetic field can be obtained by using a minimum number of measurement probes—in particular by at least a single measurement probe.

However, it is understood, that the present invention is not limited to only a single measurement probe. Moreover, it is also possible to use a number of one or more measurement probes which can be arranged at the mechanical positioning structure. In particular, the distance between the individual measurement probes and the axis around which the measurement probes are rotating may be different. In this way, it is possible to obtain measurement signals relating to a plurality of circular tracks at a same time. Thus, the time for measuring the electromagnetic field can be further reduced. Furthermore, it may be possible to perform a plurality of successive measurements by locating one or more measurement probes on the mechanical probe positioning structure at different positions. In other words, a first measurement sequence may be performed by locating the one or more measurement probes at predetermined positions on the mechanical probe positioning structure, and successively, the position of the one or more measurement probes may be changed for a number of one or more further measurement sequences. In this way, a huge number of spatial positions can be covered by only a minimum number of measurement probes.

Further embodiments of the present invention are subject of the further sub-claims and the following description referring to the drawings.

In a possible embodiment, the mechanical probe positioning structure may comprise a rod or spoke for carrying the measurement probe. In particular, the mechanical probe positioning structure may have any kind of rod-shaped structure or another longitudinal structure for carrying the measurement probe. By using such a rod-shaped structure, in particular by using a spoke or the like for carrying the measurement probe, the influence of the measurement arrangement on the electromagnetic field in the surrounding of the measurement arrangement can be minimized. In particular, the predetermined axis around which the measurement probe is rotating may be perpendicular to a longitudinal axis of the rod or the spoke on which the measurement probe is arranged.

For instance, the mechanical probe positioning structure may be formed as a thin spoke or rod. Especially, the mechanical probe positioning structure may be built by a dielectric material having only small influence on the electromagnetic field.

In a possible embodiment, the mechanical probe positioning structure may comprise a number of one or more probe holders for receiving the measurement probe. In particular, the distance between the predetermined axis around which the probe is rotating and the measurement holders may be different. In this way, the probe may be subsequently placed in one of these probe holders, and the measurement sequence is performed by measuring a plurality of spatial positions on a circular track. Accordingly, by subsequently arranging the measurement probe at the different probe holders and performing a measurement sequence for each circular track relating to the respective probe holder, a huge number of spatial positions can be covered for measuring the electromagnetic signals.

The probe holders may be any kind of appropriate arrangement for fixing the measurement probe at a predetermined position on the mechanical probe positioning structure. For example, the probe holder may comprise a mechanical arrangement for fixing the measurement probe at a predetermined position. However, it is understood that any kind of arrangement for fixing the measurement probe at a predetermined position may be possible. For instance, the measurement probe may be fixed by means of a screw, a clamp or the like.

In a possible embodiment, the mechanical probe positioning structure may comprise a moving unit for moving the measurement probe in a direction perpendicular to the predetermined axis around which the measurement probe is rotating. Accordingly, the distance between the predetermined axis and the measurement probe can be changed automatically.

The moving unit for moving the measurement probe may be any kind of appropriate moving unit which can adapt the distance between the predetermined axis and the measurement probe. For instance, the moving unit may be a longitudinal drive unit. In particular, it may be possible that the moving unit may further comprise a sensing element for reporting a distance between the predetermined axis and the measurement probe. In this way, it may be possible that the current distance can be reported to the analyzing device and the analyzing device can take into account this information for determine the spatial position of the measurement probe.

However, it is understood that any other device for moving the measurement probe is possible, too. Furthermore, any other scheme for determining the distance between the predetermined axis and the measurement probe and therefore for determining the spatial position of the measurement probe may be possible, too.

In a possible embodiment, the measurement probe may be adapted to measure at least two different polarizations of the electromagnetic signal. Especially, the measurement probe may be adapted to differentiate the polarizations of the received electromagnetic signals. Accordingly, different measurement signals may be provided relating to different polarizations of the received electromagnetic signals by the measurement probe. In this way, the polarization of the received electromagnetic signals can be further taken into account for determining the electromagnetic field.

Alternatively, it may be also possible that the measurement probe may only take into account the magnitude of the received electromagnetic field without considering the polarization of the received electromagnetic signal.

In a possible embodiment, the measurement probe may be adapted to measure only a single polarization of the received electromagnetic signal. For example, the measurement probe may comprise a measurement antenna receiving only electromagnetic signals having a predetermined polarization. Alternatively, it may be also possible to apply a polarization filter for limiting the electromagnetic signal to only a single polarization. It is understood that any other scheme for limiting the polarization of the received electromagnetic signals may be also possible.

Furthermore, it may be possible to perform a number of at least two measurement sequences by rotating the measurement probe around the predetermined axis, wherein the orientation of the measurement probe is changed in order to receive electromagnetic signals having different polarizations depending on the orientation of the measurement probe on the mechanical probe positioning structure. In this way, it may be possible to consider different polarizations by performing multiple measurement sequences subsequently and adapting the orientation of the measurement probe for receiving the electromagnetic signals having different polarizations. Moreover, it may be possible to use separate measurement probes simultaneously for measuring separate polarizations.

In a possible embodiment, the measurement probe may be adapted to provide an optical measurement signal corresponding to the measured electromagnetic signal. For example, the measurement probe may comprise a converter for converting a received electromagnetic signal to a corresponding optical signal. Accordingly, the measurement probe may output an optical signal which can be forwarded to the analyzing device by means of an optical transmission medium, for instance an optical fiber or the like. In this way, electromagnetic interferences can be further reduced.

In a possible embodiment, the measurement probe may comprise a power sensor. In particular, it may be possible to measure electromagnetic signals by means of a power sensor which outputs a signal corresponding to the magnitude of the received electromagnetic signal. Accordingly, by applying a power sensor in the measurement probe, a very simple and cheap measurement of electromagnetic signals can be achieved.

In a possible embodiment, the measurement probe may comprise a reflector. The reflector may be located at a predetermined position of the mechanical probe positioning structure. Furthermore, the reflector may reflect an incoming electromagnetic signal to a measurement antenna located at a predetermined position. Accordingly, the measurement antenna may be securely mounted on the mechanical probe positioning structure, while the reflector can be easily moved around in order to change a distance between the predetermined axis and the reflector. In this way, the change of the distance between the predetermined axis and the receiving position of the electromagnetic signal which is specified by the position of the reflector can be easily changed, even though the probe antenna and the further hardware for receiving the electromagnetic signal can be securely mounted.

In a possible embodiment, the mechanical probe positioning structure may comprise an angular sensor. The angular sensor can be adapted to provide an angular signal corresponding to the rotational angle of the mechanical probe positioning structure with respect to the predetermined reference position. The angular sensor may be any kind of sensor which can provide a measurement signal corresponding to the angular position of the mechanical probe positioning structure. For instance, the angular sensor may output an analogue or digital signal which corresponds to the current angular position.

However, it is understood that any other method for determining the angular position of the mechanical probe positioning structure and/or the measurement probe may be possible, too. For instance, an optical sensor, a camera for any appropriate sensing system for determining the position of the measurement probe may be also applied.

In a possible embodiment, the mechanical probe positioning structure may comprise a drive unit for rotating the measurement probe around the predetermined axis. For instance, the drive unit may comprise an electric motor or the like. However, it is understood that any other appropriate unit for rotating the mechanical probe positioning structure may be also possible. In this way, an automated rotating of the measurement probe by means of the mechanical probe positioning structure can be achieved. Especially, the drive unit may be controlled by the analyzing device. In this way, the analyzing device can easily obtain information about the current position of the measurement probe and correlate this position with the received measurement signal.

In a possible embodiment, the measurement arrangement may further comprise a signal generator. The signal generator may be adapted to generate a test signal. The generated test signal may be emitted, for instance by an appropriate antenna or antenna system. Especially, the generated test signal may be emitted in a direction of the measurement probe. Furthermore, the measurement probe and the associated mechanical probe positioning structure may be arranged, for instance in a quiet zone with respect to the emitted test signal.

In a possible embodiment, the test arrangement may comprise a measurement chamber. The measurement chamber may accommodate at least the measurement probe and the mechanical probe positioning structure. In particular, the measurement chamber may comprise an anechoic chamber. The anechoic chamber may comprise, for instance radiation absorbing material for absorbing radiofrequency signals in order to avoid unwanted reflections.

In a possible embodiment, the mechanical probe positioning structure may be located at a quiet zone of the measurement chamber. In this way, the measurement arrangement may measure the electromagnetic field in this quiet zone or any other desired region of the measurement chamber in order to characterize the electromagnetic field at the respective position.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
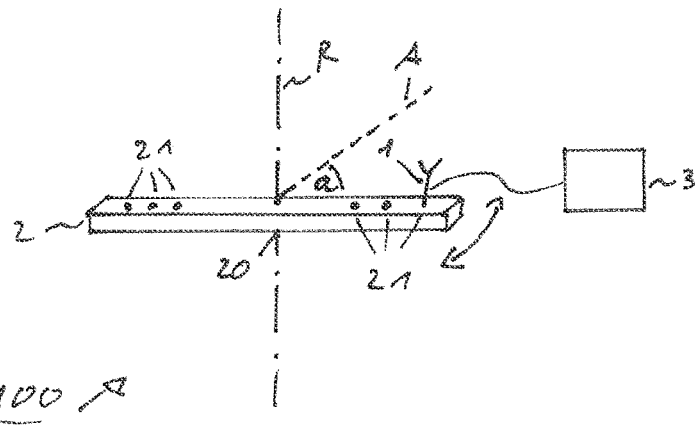
FIG. 1 shows a block diagram of an embodiment of a measurement arrangement according to the present invention.

The appended drawings are intended to provide further under-standing of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated other-wise.

DETAILED DESCRIPTION OF THE DRAWINGS

FIG. 1 shows a block diagram of a measurement arrangement 100. The measurement arrangement 100 comprises a measurement probe 1, a mechanical probe positioning structure 2 and an analyzing device 3. The measurement probe 1 receives electromagnetic signals and forwards a measurement signal corresponding to the received electromagnetic signal to the analyzing device 3. For example, the measurement probe 1 may comprise a probe antenna or an antenna arrangement comprising multiple probe antennas. For example, the measurement probe 1 may comprise one or more probe antennas, each probe antenna receiving electromagnetic signals having a predetermined polarization. Accordingly, separate measurement signals can be provided for each polarization. Furthermore, it may be also possible that the measurement probe 1 may receive only electromagnetic signals having a single predetermined polarization. In this case, a measurement signal is provided only for this predetermined polarization. However, it is understood that the measurement probe 1 may also receive electromagnetic signals without taking into account the polarization of the electromagnetic signal. For example, measurement probe 1 may comprise a power analyzing element which provides an output signal corresponding to the received electromagnetic signal without taking into account the polarization. Accordingly, measurement probe 1 may provide for this case only an output signal corresponding to the magnitude of the measured electromagnetic signal. However, it is understood that any other measurement of the received electromagnetic signal may be also possible.

The measurement signal which is output by the measurement probe 1 may be provided to the analyzing device 3, for instance by means of a wired connection. For example, the wired connection 30 may comprise a cable, e.g. a coaxial cable. However, any other wired connection between the measurement probe and the analyzing device 3 may be also possible. Furthermore, it may be also possible that the measurement probe may convert the measurement signal into an optical signal and forward the optical signal to the analyzing device 3. For example, the optical signal may be provided to the analyzing device 3 by means of an optical transmission medium, e.g. an optical fiber or the like. Furthermore, it may be also possible that the measurement signal may be provided to the analyzing device 3 by means of a wireless link, for example by means of an optical link applying visible or invisible light.

Even though only a single measurement probe 1 is illustrated in FIG. 1, it is understood, that the present invention is not limited to only a single measurement probe 1. Furthermore, it may be also possible that the measurement arrangement 100 may comprise any number of one or more measurement probes 1. For example, the measurement arrangement 100 may comprise separate measurement probes 1 for measuring different polarizations of the electromagnetic signals.

The one or more measurement probes 1 are arranged on the mechanical probe positioning structure 2. For this purpose, the mechanical probe positioning structure 2 may comprise a number of one or more probe holders 21. Each probe holder 21 may be adapted to receive the measurement probe 1. For example, the measurement probe 1 may be fixed to the mechanical probe positioning structure 2 by means of a clamp, a screw or the like. However, it is understood, that the mounting of the measurement probe 1 on the mechanical probe positioning structure 2 is not limited to these examples. Moreover, any possibility for fixing the measurement probe 1 on the mechanical probe positioning structure 2 may be possible.

The mechanical probe positioning structure 2 can be rotated around a predetermined rotation axis R. For this purpose, the mechanical probe positioning structure 2 may comprise a rotation point 20. For example, this rotation point 20 may comprise a hinge, bearing or the like for rotating the mechanical probe positioning structure 2. In particular, the predetermined rotation axis R may be perpendicular to a line between the rotation point 20 and the position at which the measurement probe 1 is located on the mechanical probe positioning structure 2. Accordingly, by rotating the mechanical probe positioning structure 2 around the predetermined axis R, the measurement probe 1 is rotating along a circular track. The spatial position of the measurement probe 1 may be specified by an angle a describing an angle between a reference line A and the line between the reference point 20 and the position of the measurement probe 1 on the mechanical probe positioning structure 2. Furthermore, the spatial position of the measurement probe 1 may be specified based on the distance d between the reference point 20 and the measurement probe 1 on the mechanical probe positioning structure 2.

The mechanical probe positioning structure 2 may be any kind of appropriate platform for carrying and moving a number of one or more measurement probes 1. In general, the mechanical probe positioning structure 2 may be a plate, especially a disc-shaped plate on which a number of one or more probes 1 may be arranged. However, the mechanical probe positioning structure 2 may preferably have a rod-shaped structure. For example, the mechanical probe positioning structure 2 may be formed as a spoke or a rod or the like. In particular, the mechanical probe positioning structure 2 may be formed at least in part, based on a dielectric material. In this way, the influence of the mechanical probe positioning structure and therefore the influence of the measurement arrangement 100 on the electromagnetic field can be reduced.

Analyzing device 3 may determine a current spatial position of measurement probe 1 based on the angle a with respect to the predetermined reference position A. Additionally, analyzing device 3 may further take into account the distance d between the reference point 20 and the position of measurement probe 1 on the mechanical probe positioning structure 2. Accordingly, analyzing device 3 may receive the measurement signal provided by measurement probe 1 and associate the obtained measurement signal with the spatial position of measurement probe 1.

For example, analyzing device 3 may comprise a memory for storing the obtained measurement signal in association with the determined spatial position of measurement probe 1. Accordingly, analyzing device 3 may compute properties on an electromagnetic field based on the obtained measurement signals measured by the measurement probe 1 at a number of at least two different spatial positions of measurement probe 1. The properties of the electromagnetic field may be computed, for instance in a predetermined grid. For example, the values may be interpolated based on the measurement values provided by the measurement probe 2. However, it is understood that any other scheme for determining the electromagnetic field and its properties may be possible, too.

However, it is understood, that a larger number of spatial positions and corresponding measurement signals may enhance the accuracy of the computed properties of the electromagnetic field. Especially, the measurement of the electromagnetic signals by measurement probe 1 is not limited to spatial positions on a particular circular track having only a single distance between reference point 20 and the measurement probe 1. Moreover, the position of measurement probe 1 on the mechanical probe positioning structure 2 may be changed. For example, the mechanical probe positioning structure 2 may comprise multiple probe holders 21 for receiving a measurement probe 1. In particular, the distance between the reference point 20 and the probe holders 21 may be different. Accordingly, by arranging measurement probe 1 successively at different probe holders 21-*i*, it is possible to move around the measurement probe 1 at different circular tracks. In this way, a plurality of different spatial positions can be achieved and corresponding measurement signals can be obtained. In this way, it is possible to cover a large spatial area by means of only a single measurement probe 1.

However, it is understood, that it is also possible to apply more than measurement probe 1 at a same time for measuring the electromagnetic signal. Accordingly, analyzing device 3 may receive measurement signals from any number of one or more measurement probes 1 and determine the corresponding spatial position for each measurement probe 1. Thus, the properties of the electromagnetic field can be computed based on the measurement data and the corresponding spatial positions even by means of more than one measurement probes 1.

Analyzing device 3 may be any kind of processing device. For example, analyzing device 3 may comprise a signal input for receiving the measurement signals from measurement probe 1. Furthermore, analyzing device 3 may also comprise an input for receiving signals corresponding to the angular orientation of the mechanical probe positioning structure 2, in particular corresponding to angle a. The signals may be obtained as analogue or digital signals. Analyzing device 3 may comprise, for example, a general purpose processor with corresponding instructions. Further, analyzing device 3 may comprise interfacing elements which are coupled to the processor for receiving the measured signals from the measurement probe 1 and/or further sensors and provide the signals to the processor. Such interfacing elements may comprise, for example, analogue-to-digital converters that convert received signals into digital data that may be processed by the processor. Analyzing device 3 may comprise hardware elements, like a processing unit. However, analyzing device 3 may also be a software implemented at least in part. In particular, instructions may therefore be stored in a memory that is coupled to a general purpose processor, for example via a memory bus. The processor may execute an operating system that loads and executes the instructions. The processor may be, for example an Intel processor that runs a Windows or Linux operating system which loads and executes the instructions. Furthermore, the processor may be also a processor of a measurement device that may run, for example, an embedded operating system that loads and executes the instructions.

For example, analyzing device 3 may successively receive measurement data from measurement probe 1 and store these measurement data in association with the corresponding spatial position of the measurement probe 1. After obtaining the measurement data and the corresponding spatial positions, analyzing device 3 may compute a map taking into account the measurement data and based on this map the properties of an electromagnetic field may be computed. These properties may specify, for example amplitude and/or polarization of electromagnetic signals or waves.

Accordingly, analyzing device 3 may provide any kind of appropriate data for specifying the electromagnetic field covered by the movement of the one or more measurement probes 1 moved by the mechanical probe positioning structure 2 along the circular tracks.

Figure 2:
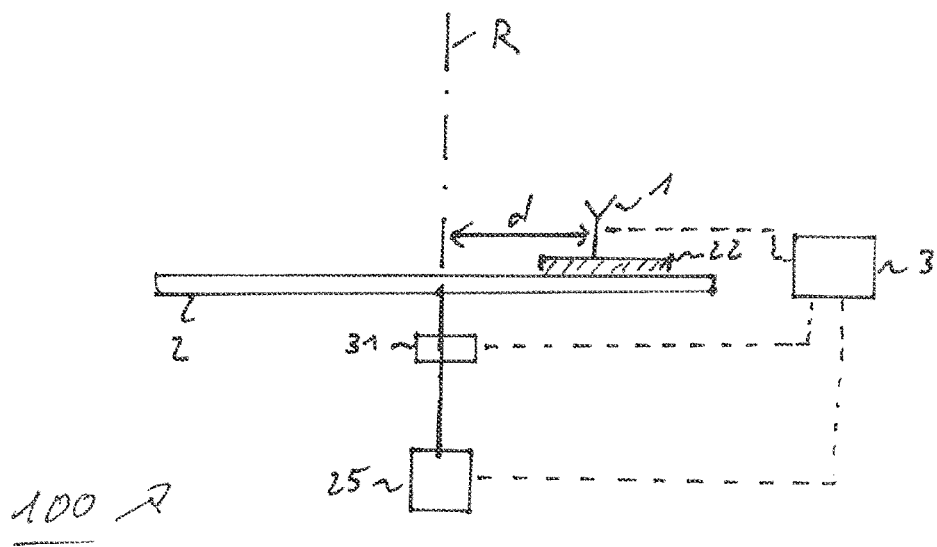
FIG. 2 shows a block diagram of another embodiment of a measurement arrangement according to the present invention.

FIG. 2 shows a block diagram of a further embodiment of a measurement arrangement 100. This arrangement mainly corresponds to the arrangement which has been described in association with FIG. 1. Thus, the corresponding explanations of FIG. 1 also apply to the embodiment of FIG. 2. The embodiment of FIG. 2 further comprises a moving unit 22 for moving measurement probe 1 along the mechanical probe positioning structure 2. In particular, moving unit 22 moves probe 1 in a direction to/from the predetermined axis R around which the measurement probe 1 is rotating. In other words, the direction along which the measurement probe 1 is moved by the moving unit 22 is perpendicular to the predetermined axis R.

Accordingly, moving device 22 may move the probe 1 along a longitudinal axis of a rod-shaped mechanical probe positioning structure 2.

In order to rotate the mechanical probe positioning structure 2 along the predetermined axis R, an appropriate drive device 25, for instance an electronic motor or the like may be used. In particular, a stepper motor or the like may be used for precisely controlling the rotation of the mechanical probe positioning structure 2. However, it is understood that any other device for rotating the mechanical probe positioning structure may be also applied.

Furthermore, an angular sensor 31 may be used for providing signals corresponding to the rotational position of the mechanical probe positioning structure 2. For example, the angular sensor 31 may provide an analogue or digital signal corresponding to the angle a between a reference position A and the measurement probe 1. However, it is understood, that any other sensor may be also applied for determining the angular position of the mechanical probe positioning structure 2 and/or the spatial position of measurement probe 1. For example, any kind of optical sensor (such as a camera or the like) may be used for identifying the spatial position of the measurement probe 1.

Figure 3:
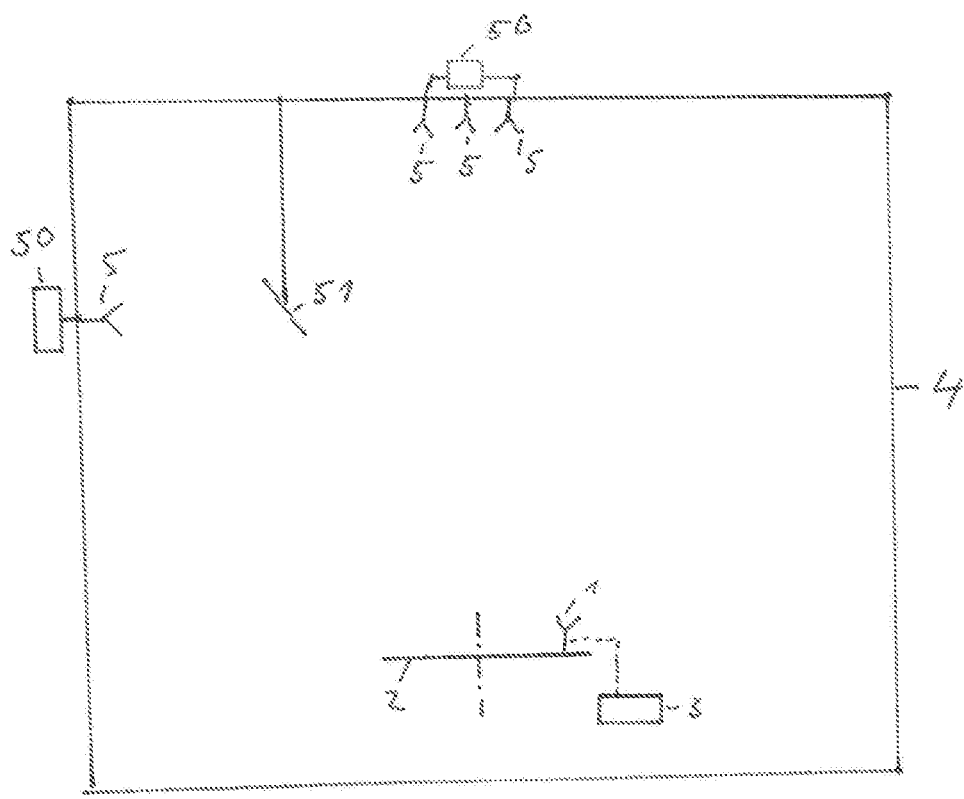
FIG. 3 shows a block diagram of another embodiment of a measurement arrangement according to the present invention.

FIG. 3 illustrates a further embodiment of a measurement arrangement 100 according to an embodiment. This embodiment mainly corresponds to the previously described embodiments with respect to FIG. 1 and FIG. 2. Thus, the corresponding explanation is also valid for the embodiment according to FIG. 3. As can be seen in FIG. 3, the mechanical probe positioning structure 2 with the number of one or more probes 1 may be arranged in a measurement chamber 4. In particular, the measurement chamber 4 may comprise an anechoic measurement chamber. Such an anechoic measurement chamber may be covered, for example with radiation absorbing material. Furthermore, one or more measurement antennas 5 may be arranged in the measurement arrangement. For example, the measurement antennas 5 may be arranged on a sidewall or the ceiling of the measurement chamber 4. A signal generator 50 may generate test signals which are provided to the measurement antennas 5. Even though illustrated as separate devices, it may be also possible that the test generator 50 may be arranged within the analyzing device 3.

The measurement antennas 5 may emit test signals in an arbitrary direction. For example, measurement antenna 5 may emit the test signals in the direction of the mechanical probe positioning structure 2 with measurement probe 1. Furthermore, the measurement arrangement may also comprise a reflector 51 for reflecting the test signals emitted by a measurement antenna 5. Thus, be emitting test signals directly by a measurement antenna 5 or by reflecting the emitted test signals by means of a reflector 51, a predetermined electromagnetic field can be generated within the measurement chamber 4. The mechanical probe positioning structure 2 with the measurement probe 1 may be used for measuring the electromagnetic field and determining characterizing parameters such as amplitude and/or polarization of the electromagnetic field.

In particular, the mechanical probe positioning structure 2 with the measurement probe 1 may be arranged at a quiet zone of the generated electromagnetic field. Furthermore, it may be also possible to arrange the mechanical probe positioning structure 2 with the measurement probe 1 at a predetermined distance from the quiet zone of the electromagnetic field within the measurement chamber 4.

For sake of clarity in the following description of the method based on FIG. 4 the reference signs used above in the description of the measurement arrangement based on FIGS. 1 to 3 will be maintained.

Figure 4:
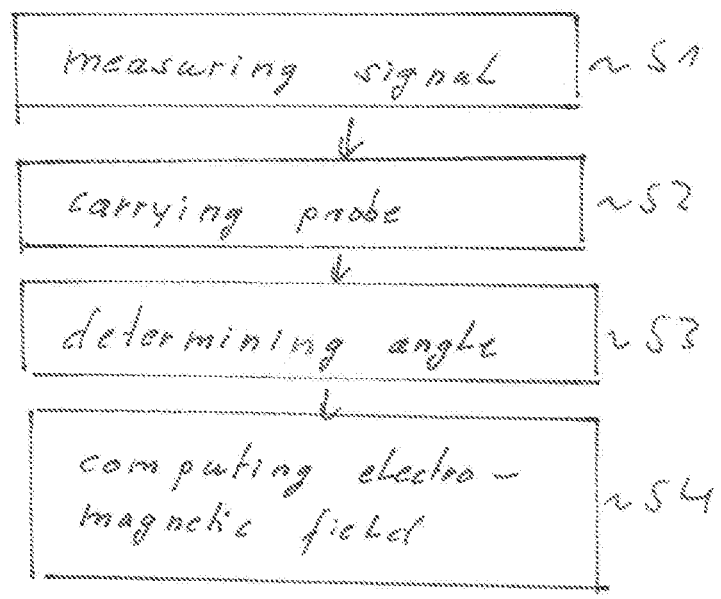
FIG. 4 shows a block diagram of an embodiment of a measurement method according to the present invention.

FIG. 4 shows a flowchart of a measurement method according to an embodiment.

The measurement method may measure an electromagnetic field, for example an electromagnetic field with a measurement chamber. The measurement method may comprise measuring (S1) an electromagnetic signal by a measurement probe 1 and provide a measurement signal corresponding to the measured electromagnetic signal. The method may further comprise carrying (S2) the measurement probe 1 and controllably move the measurement probe 1 by a mechanical probe positioning structure 2. In particular, the mechanical probe positioning structure 2 may perform a rotational movement around a predetermined axis R. Further, the method may comprise determining (S3) a rotational angle of the mechanical probe positioning structure 2 with respect to a predetermined reference position A.

Finally, the method may compute (S4) an electromagnetic field based on measurement signals measured at a number of at least two different rotational angles.

Summarizing, the present invention provides a measurement of an electromagnetic field. It is for this purpose that a measurement probe is arranged on a mechanical probe positioning structure and moved along a number of one or more circular tracks. In this way, the measurement probe can be subsequently located at multiple different spatial positions and the corresponding electromagnetic signal can be measured. Accordingly, properties of an electromagnetic field can be determined by taking into account the measured electromagnetic signal with respect to the related spatial position.

What we claim is:

1. A measurement arrangement for measuring an electromagnetic field, the measurement arrangement comprising:
   a measurement probe adapted to measure an electromagnetic signal and to provide a measurement signal corresponding to the measured electromagnetic signal;
   a mechanical probe positioning structure formed by a rotatable platform adapted to carry the measurement probe on a surface thereof and having a rotation point through which a predetermined rotation axis extends perpendicularly to the platform surface and to controllably move the measurement probe, wherein the mechanical probe positioning structure is further adapted to perform a rotational movement of the measurement probe around the predetermined rotation axis such that the measurement probe is rotating along a circular track, wherein the mechanical probe positioning structure comprises a moving device for moving the measurement probe in a direction perpendicular to the predetermined rotation axis along the platform surface and wherein the measurement probe is adapted to measure at least two different polarizations of the electromagnetic signal; and
   an analyzing device adapted to determine a rotational angle of the mechanical probe positioning structure with respect to a predetermined reference position, and to compute an electromagnetic field based on measurement signals measured by the measurement probe at a number of at least two different rotational angles.

2. The measurement arrangement of claim 1, wherein the rotatable platform comprises a disc-shaped plate or a rod or a spoke for carrying the measurement probe, and the predetermined axis or rotating the mechanical probe positioning structure is perpendicular to a longitudinal axis of the rod or spoke.

3. The measurement arrangement of claim 1, wherein the mechanical probe positioning structure comprises a number of probe holders for receiving the measurement probe.

4. The measurement arrangement of claim 1, wherein the measurement probe is adapted to provide an optical measurement signal corresponding to the measured electromagnetic signal.

5. The measurement arrangement of claim 1, wherein the measurement probe comprises a power sensor.

6. The measurement arrangement of claim 1, wherein the measurement probe comprises a reflector located at the predetermined position at the mechanical probe positioning structure.

7. The measurement arrangement of claim 1, wherein the mechanical probe positioning structure comprises an angular sensor adapted to provide an angular signal corresponding to the rotational angle of the mechanical probe positioning structure with respect to the predetermined reference position.

8. The measurement arrangement of claim 1, wherein the mechanical probe positioning structure comprises a drive device for rotating the mechanical probe positioning structure around the predetermined axis.

9. The measurement arrangement of claim 1, comprising a signal generator adapted to generate a test signal and emit the generated test the signal.

10. The measurement arrangement of claim 1, comprising a measurement chamber that accommodates the measurement probe and the mechanical probe positioning structure.

11. The measurement arrangement of claim 10, wherein mechanical probe positioning structure is located at a quiet zone of the measurement chamber.

12. A measurement method for measuring an electromagnetic field, the measurement method comprising:
   measuring an electromagnetic signal by a measurement probe and provide a measurement signal corresponding to the measured electromagnetic signal;
   carrying the measurement probe on a surface of a rotatable platform of a mechanical probe positioning structure, the rotatable platform having a rotation point through which a predetermined rotation axis extends perpendicularly to the platform surface, and to controllably move the measurement probe by a mechanical probe positioning structure, wherein the mechanical probe positioning structure performs a rotational movement of the measurement probe around the predetermined axis such that the measurement probe is rotating along a circular track;
   determining a rotational angel of the mechanical probe positioning structure with respect to a predetermined reference position;
   computing an electromagnetic field based on measurement signals measured at a number of at least two different rotational angles; and
   wherein the mechanical probe positioning structure comprises a moving device and the method further comprises, by the mechanical probe positioning structure, the step of moving the measurement probe in a direction perpendicular to the predetermined rotation axis along the platform surface and, by the measurement probe, the step of measuring at least two different polarizations of the electromagnetic signal.

* * * * *